(12) United States Patent
Gorlow et al.

(10) Patent No.: US 12,087,317 B2
(45) Date of Patent: Sep. 10, 2024

(54) DIALOGUE ENHANCEMENT IN AUDIO CODEC

(71) Applicant: DOLBY INTERNATIONAL AB, Amsterdam Zuidoost (NL)

(72) Inventors: Stanislaw Gorlow, Stockholm (SE); Leif Jonas Samuelsson, Sundbyberg (SE); Holger Hoerich, Fuerth (DE); Tobias Friedrich, Fürth (DE)

(73) Assignee: DOLBY INTERNATIONAL AB, Dublin (IE)

( * ) Notice: Subject to any disclaimer, the term of this patent is extended or adjusted under 35 U.S.C. 154(b) by 298 days.

(21) Appl. No.: 17/603,149

(22) PCT Filed: Apr. 15, 2020

(86) PCT No.: PCT/EP2020/060534
§ 371 (c)(1),
(2) Date: Oct. 12, 2021

(87) PCT Pub. No.: WO2020/212390
PCT Pub. Date: Oct. 22, 2020

(65) Prior Publication Data
US 2022/0199101 A1 Jun. 23, 2022

Related U.S. Application Data

(60) Provisional application No. 62/833,855, filed on Apr. 15, 2019, provisional application No. 62/882,722, filed on Aug. 5, 2019.

(30) Foreign Application Priority Data

Apr. 15, 2019 (EP) ..................... 19169218

(51) Int. Cl.
*G10L 21/0308* (2013.01)
*G10L 19/008* (2013.01)
(Continued)

(52) U.S. Cl.
CPC ........ *G10L 21/0308* (2013.01); *G10L 19/008* (2013.01); *H03G 5/165* (2013.01); *H03G 9/18* (2013.01)

(58) Field of Classification Search
None
See application file for complete search history.

(56) References Cited

U.S. PATENT DOCUMENTS 7,680,288 B2 3/2010 Melchior
7,742,609 B2 6/2010 Yeakel
(Continued)

FOREIGN PATENT DOCUMENTS

GB 2491002 B 10/2013
GB 2566760 B 10/2019
(Continued)

OTHER PUBLICATIONS

Kuba Lopatka, et al "Improving Listeners' Experience for Movie playback Through Enhancing Dialogue Clarity in Soundtracks" Digital Signal Processing, vol. 48, Jan. 1, 2016, pp. 40-49.

*Primary Examiner* — Jonathan C Kim

(57) ABSTRACT

Dialogue enhancement of an audio signal, comprising obtaining a set of time-varying parameters configured to estimate a dialogue component present in said audio signal, estimating the dialogue component from the audio signal, applying a compressor only to the estimated dialogue component, to generate a processed dialogue component, applying a user-determined gain to the processed dialogue component, to provide an enhanced dialogue component. The processing of the estimated dialogue may be performed on the decoder side or encoder side. The invention enables an improved dialogue enhancement.

20 Claims, 7 Drawing Sheets

(51) Int. Cl.
*H03G 5/16* (2006.01)
*H03G 9/18* (2006.01)

(56) References Cited

U.S. PATENT DOCUMENTS

| | | | |
|---|---|---|---|
| 8,284,960 B2 | 10/2012 | Vaudrey | |
| 8,447,042 B2 | 5/2013 | Gurin | |
| 9,373,313 B2 | 6/2016 | Chapman | |
| 9,613,640 B1 | 4/2017 | Balamurali | |
| 10,020,006 B2 | 7/2018 | Fairey | |
| 10,057,703 B2 | 8/2018 | Wu | |
| 10,147,432 B2* | 12/2018 | Fuchs | G10L 19/012 |
| 2001/0001853 A1* | 5/2001 | Mauro | G10L 21/02 |
| | | | 704/E21.002 |
| 2003/0169886 A1 | 9/2003 | Boyce | |
| 2005/0277469 A1 | 12/2005 | Pryzby | |
| 2010/0017205 A1* | 1/2010 | Visser | G10L 19/00 |
| | | | 704/E21.002 |
| 2010/0106507 A1 | 4/2010 | Muesch | |
| 2011/0081026 A1* | 4/2011 | Ramakrishnan | G10L 21/0208 |
| | | | 381/94.3 |
| 2012/0209601 A1 | 8/2012 | Jing | |
| 2015/0106088 A1* | 4/2015 | Jarvinen | G10L 21/0208 |
| | | | 704/233 |
| 2015/0201255 A1 | 7/2015 | Porter | |
| 2015/0319527 A1 | 11/2015 | Petit | |
| 2015/0332680 A1 | 11/2015 | Crockett | |
| 2016/0197590 A1* | 7/2016 | Koppens | H03G 7/007 |
| | | | 381/106 |
| 2016/0358614 A1 | 12/2016 | Phielipp | |
| 2017/0003929 A1* | 1/2017 | Ryckman | G10H 1/361 |
| 2017/0249945 A1* | 8/2017 | Koppens | G10L 19/008 |
| 2018/0233156 A1 | 8/2018 | Breebaart | |
| 2019/0037331 A1* | 1/2019 | Samuelsson | H04S 3/00 |
| 2020/0227052 A1 | 7/2020 | Breebaart | |
| 2020/0251123 A1* | 8/2020 | Fuchs | G10L 21/0232 |
| 2022/0199101 A1* | 6/2022 | Gorlow | G10L 19/008 |

FOREIGN PATENT DOCUMENTS

| | | | | |
|---|---|---|---|---|
| JP | 2010518455 | A | 5/2010 | |
| JP | 2014089420 | A | 5/2014 | |
| JP | 2014139658 | A | 7/2014 | |
| JP | 2015022236 | A | 2/2015 | |
| JP | 2019508947 | A | 3/2019 | |
| RU | 2520420 | C2 | 6/2014 | |
| WO | 2008106036 | A2 | 9/2008 | |
| WO | 2010011377 | A2 | 1/2010 | |
| WO | 2011112382 | A1 | 9/2011 | |
| WO | 2012097210 | A1 | 7/2012 | |
| WO | 2017035163 | A1 | 3/2017 | |
| WO | 2017035281 | A2 | 3/2017 | |
| WO | WO-2017132396 | A1 * | 8/2017 | H04R 5/04 |

* cited by examiner

DIALOGUE ENHANCEMENT IN AUDIO CODEC

CROSS-REFERENCE TO RELATED APPLICATIONS

This application claims priority of the following priority applications: U.S. provisional application 62/833,855 (reference: D18119USP1), filed 15 Apr. 2019, EP application 19169218.5 (reference: D18119EP), filed 15 Apr. 2019 and U.S. provisional application 62/882,722 (reference: D18119USP2), filed 5 Aug. 2019 which are hereby incorporated by reference.

FIELD OF THE TECHNOLOGY

The present disclosure relates to dialogue enhancement in audio encoder-decoder (codec) systems.

BACKGROUND

Support for dialogue enhancement functionality is typically included in state of the art audio coding/decoding systems.

In dual-ended systems, information for enhancing dialogue may be included in the bit stream transmitted from the encoder to the decoder. The information is typically referred to as a set of time-varying dialogue enhancement (DE) parameters, including one parameter per frequency band (and per channel). A time slot together with a frequency band (in one channel) is jointly referred to as a "time-frequency tile", and the DE parameters represent time-varying gains for each such tile. On the decoder side, the DE parameters may be applied together with a user-determined dialogue gain to provide a dialogue enhanced signal.

However, the effect of dialogue enhancement in such systems can be perceived as too subtle, and an improved processing is therefore desired.

In other areas, dialogue enhancement has been proposed including combinations of equalization and compression, see e.g. US 2012/0209601. However, such solutions are not immediately applicable to an audio codec system.

General disclosure of the embodiments of the invention Therefore, it is an object of the present disclosure to provide an improved dialogue enhancement in an audio codec system.

According to the present disclosure, this and other objects are achieved by subjecting an estimated dialogue component to additional processing, including compression (and optionally equalization), thereby enabling an improved dialogue enhancement. An embodiment of the disclosure is based on the realization that dialogue enhancement in an audio codec system can be significantly improved. Further, in a dual-ended system according to an embodiment of the present invention, the dialogue enhancement (DE) parameters, conventionally applied as linear gains directly to the audio signal, are instead used to estimate the dialogue component, to thereby allow the additional processing.

According to the first aspect of an embodiment of the present invention, the additional processing of the estimated dialogue component is performed on the decoder side.

More specifically, the first aspect relates to a method for dialogue enhancement of an audio signal, comprising receiving an encoded bit stream including an audio signal, obtaining a set of time varying parameters configured to estimate a dialogue component present in the audio signal, estimating the dialogue component from the audio signal, applying a compressor to the estimated dialogue component to generate a processed dialogue component, applying a user-determined gain to the processed dialogue component to generate an enhanced dialogue component, and combining the enhanced dialogue component with the audio signal to form a dialogue enhanced audio signal.

The first aspect also relates to a decoder for dialogue enhancement of an audio signal, the decoder having obtained a set of time-varying parameters configured to estimate a dialogue component present in the audio signal, the decoder comprising a decoder element for decoding the audio signal received in an encoded bit stream, a dialogue estimator for estimating the dialogue component from the audio signal, a compressor for compressing the estimated dialogue component to generate a processed dialogue component, a gain element for applying a user determined gain to the processed dialogue component, to provide an enhanced dialogue component, and a combining path for combining the enhanced dialogue component with the audio signal to form a dialogue enhanced audio signal.

In a single-ended system, the time-varying parameters for estimating the dialogue component may be determined in the decoder or even be preset. However, in a preferred implementation, the decoder is part of a dual-ended system, in which case the parameters can be included in the encoded bit stream (e.g. corresponding to the dialogue enhancement (DE) parameters known in the art).

The compressor is advantageously applied only on the estimated dialogue component of the audio signal. The compressor is advantageously applied prior to applying the user-determined gain, and prior to combining the enhanced dialogue component with the audio signal. In conventional decoders, the whole audio signal including dialogue and non-dialogue components may be typically boosted during processing the audio signal. In conventional decoders, a limiter may be typically applied to the boosted signal to avoid that the boosted signal goes into saturation, thereby preventing clipping of the boosted signal. In the first aspect of the embodiment of the present invention, the compressor has a different purpose than a conventional limiter, e.g. typically inserted at the decoder output. The compressor according to the first aspect is used to increase the average power of only the dialogue component of the audio signal while keeping the peak level of the audio signal unchanged. The user-determined gain is applied to the processed (compressed) dialogue component and combined with the audio signal, or, as in an embodiment described below, the non-dialogue component, such that the dialogue component can stand out more clearly in the processed audio signal. Therefore, according to the first aspect, the compressor increases the signal-to-noise ratio of the dialogue-enhanced audio signal between the dialogue component and the non-dialogue component of the audio signal, e.g. the background. Therefore, the compressor according to the first aspect, is not used to prevent clipping of the signal.

In an embodiment, the dialogue component comprises dialogue with a time-varying level. According to the first aspect, the compressor may bring the audio level of louder parts of the dialogue component closer to the audio level of the quieter parts.

In an embodiment, the compressor may also be configured to apply a make-up gain to the processed (compressed) dialogue component to increase the level, e.g. a peak level, of the processed dialogue component back to a level, e.g. a peak level, of the estimated dialogue component. Applying a make-up gain results in an overall increase of the level of the dialogue component, thus making the compressed dialogue component more audible.

In an embodiment further described below, a limiter may be used at the output of the decoder to prevent the processed audio signal from clipping. In cases where the dialogue component has been boosted by a simple gain, but not compressed, the limiter can significantly reduce or even cancel the perceived effect of the dialogue boost. On the other hand, by compressing and boosting the dialogue component, such that the average power of the dialogue has been increased, a perceived increase in dialogue level may be achieved even after limiting. As such, applying a compressor only to the dialogue component of the audio signal provides a dialogue enhancement system which is perceptually more robust to the output limiter.

It is understood that when equalization is also applied to the estimated dialogue component prior compression, compressing the estimated dialogue component refers to compressing the equalized estimated dialogue component.

According to the second aspect of an embodiment of the present invention, the additional processing of the estimated dialogue component is performed on the encoder side of a dual-ended system, leading to a modified dialogue enhancement (DE) parameter, which is encoded and included in the bit stream.

It is noted that although compression is a time-variant nonlinear operation, it is only the computation of the gain value that is non-linear. The actual application of the computed gain value is in fact a linear operation. The application of a static (time-invariant) equalizer curve is also linear. The inventors have therefore realized that the additional processing of the dialogue component according to an embodiment of the present invention can alternatively be realized on the encoder side by incorporating the equalizer coefficient and the compression gain (including makeup) into the set of dialogue enhancement (DE) parameters, to generate a modified set of DE parameters.

More specifically, the second aspect relates to a method for encoding an audio signal to enable dialogue enhancement, comprising providing an audio signal, providing a set of time-varying dialogue enhancement parameters configured to estimate a dialogue component present in the audio signal, estimating an estimated dialogue component by applying the dialogue enhancement parameters to the audio signal, applying a compressor to the estimated dialogue component to generate a processed dialogue component, dividing the processed dialogue component by the estimated dialogue component to determine a set of time varying adjustment gains, combining the dialogue enhancement parameters with the adjustment gains to provide a set of modified dialogue enhancement parameters, and encoding the audio signal and the modified dialogue enhancement parameters in a bit stream.

The second aspect also relates to an encoder for encoding an audio signal to enable dialogue enhancement, comprising a dialogue estimator for estimating a dialogue component present in an audio signal by applying set of time-varying dialogue enhancement parameters to the audio signal, a compressor for compressing the estimated dialogue component to generate a processed dialogue component, a divider for dividing the processed dialogue component by the estimated dialogue component to determine a set of time-varying adjustment gains, a combiner for combining the dialogue enhancement parameters with the adjustment gains to provide a set of modified dialogue enhancement parameters, and an encoder element for encoding the audio signal and the modified dialogue enhancement parameter in a bit stream.

The advantageous effects of the compressor described with reference to the first aspect of the embodiments of the invention are also achieved with the second aspect of the various embodiments of the invention.

Both aspects (decoder and encoder) provide substantially the same technical effect.

An advantage of the second aspect (processing in the encoder) is that the decoder does not need to be modified. The compressor may attenuate parts of the signal that exceed a given threshold, for example parts of the signal that have a peak or RMS level above the given threshold. The compression ratio may be around 5:1 or even up to 20:1. A makeup gain can be applied to maintain the original level (e.g. peak or RMS level) of the dialogue signal.

In a dual-ended system, the encoded bit stream may also include compression parameters for configuring the compressor. Such parameters may include e.g. threshold, compression ratio, attack time, release time and makeup gain.

The additional processing of the estimated dialogue component preferably includes applying a first equalizer to the estimated dialogue component before applying the compressor. Such equalization may serve to further enhance the effect of the compression.

The term "equalizer" should be interpreted broadly and may include e.g. application of a difference equation in the time domain. In most practical examples, however, the equalizer is an element that applies a frequency-dependent (complex) gain to the estimated dialogue signal, although in some cases a real-valued gain may be sufficient.

The equalizer may include rolling off lower frequencies (e.g. below 500 Hz) and giving a small wide boost in selected frequency ranges. For a more detailed example, see below.

The step of combining the enhanced dialogue component with the audio signal may include forming an estimated non-dialogue component (sometimes referred to as M&E for "music and effects") by subtracting the estimated dialogue component from the audio signal, and then summing the estimated non-dialogue component with the enhanced dialogue component.

In some embodiments, the estimated non-dialogue component is also subject to equalization, by applying a second equalizer, before the estimated non-dialogue component is added to the enhanced dialogue component. Such a second equalizer may be functionally inter-related to the first equalizer. For example, in frequency regions where the estimated dialogue is amplified, M&E may be given a slight attenuation. Reference is made to the description of embodiments for a more detailed example.

In a dual-ended system, the encoded bit stream may also include control data or steering data for configuring the first equalizer and, if present, the second equalizer. For example, a decoder may be provided with a set of different equalizer presets, and control data in the bit stream may select which preset to apply.

BRIEF DESCRIPTION OF THE DRAWINGS

Embodiments of the present invention will be described in more detail with reference to the appended drawings.

DETAILED DESCRIPTION OF THE EMBODIMENTS

Systems and methods disclosed in the following may be implemented as software, firmware, hardware or a combination thereof. In a hardware implementation, the division of tasks does not necessarily correspond to the division into physical units; to the contrary, one physical component may have multiple functionalities, and one task may be carried out by several physical components in cooperation. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, the term computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

The following description relates to various decoder and encoder embodiments in a dual-ended codec system. It is noted that embodiments of the present invention may also be implemented in a single-ended decoder. In such an embodiment, the time-varying parameters a for estimating a dialogue component will not be received in the bit stream, but instead be determined by the decoder based on the received audio signal Y.

Decoder Side Implementation

Figure 1:
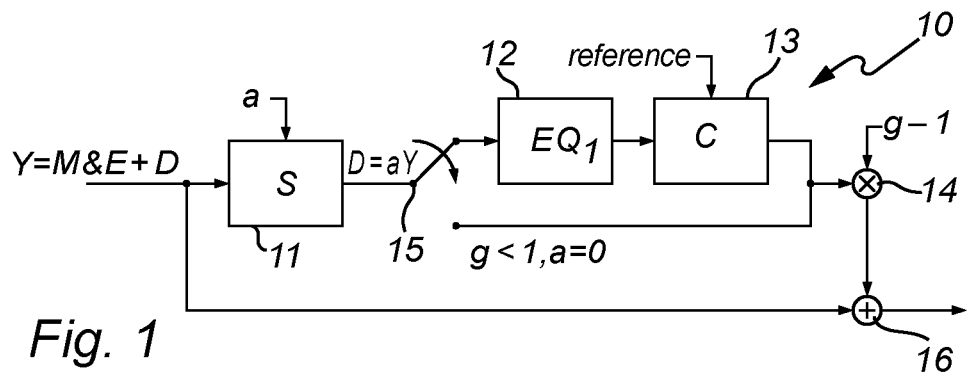
FIG. 1 is a block diagram of a decoder according to an embodiment of the present invention.

The decoder 10 in FIG. 1 comprises a dialogue estimation block 11, which receives the input audio signal Y as well as a set of time dependent dialogue enhancement (DE) parameters a from a bit stream. Although not shown in FIG. 1, the audio signal Y and the set of parameters a are both decoded from an encoded bit stream. The parameters a include parameters for each of a set of frequency bands (and of course for each dialogue carrying channel). The resolution of the time dependency is typically determined by the frame rate of the bit stream, and a specific combination of a frame (m) and a frequency band (k) is referred to as a time-frequency tile. According to this terminology, the DE parameters comprise one or more parameters $a(m, k)$ for each time-frequency tile. It is noted that the DE parameters typically have a coarser frequency resolution than the audio signal, and one DE frequency band may include several frequency bins of the audio signal. The DE parameters enable the dialogue estimation block 11 to estimate a dialogue component D present in the audio signal Y according to $D(m, k)=a(m, k)Y(m, k)$. For additional details, reference is made to WO2017/132396, herewith incorporated by reference.

The decoder further comprises a dialogue processing path, which in this embodiment includes a first equalizer 12 and a compressor 13 connected in series. The output of the compressor 13 is connected to an amplifier 14, which performs a multiplication by a factor of $g-1$, where g is a user-determined linear gain.

The user-determined gain g may represent a degree of dialogue gain to apply in general. For example, a user may set the gain g to a level the user is comfortable with, and then leave it to that level. If a user feels that the level of dialogue component is too quiet, the user can increase the level by increasing the gain g. Likewise, if a user feels that the level of the dialogue component is too loud, the user can decrease the level by decreasing the gain g. However, in most practical cases, a user may have a preference for louder dialogue components and the gain may typically be set to a value equal or higher than one.

Upstream to the equalizer 12 is arranged a switch 15, which in this embodiment is configured to connect the estimated dialogue signal D to the processing path (compressor 13 and optionally equalizer 12) only when two conditions are fulfilled:

1) the user selected gain factor g is greater than 1, and
2) the dialogue enhancement parameter a is non-zero for the time-frequency tile, i.e. there is dialogue present.

If either of these conditions are not fulfilled, the estimated dialogue component D is connected directly to the multiplier 14 without any processing. Other settings of the switch are also possible, e.g. without requiring the second condition.

Finally, the decoder comprises a summation point 16 configured to add the output from the multiplier 14 to the input audio signal Y.

In use, when $g>1$, the equalizer in FIG. 1 will process the estimated dialogue component D (with compression and optionally equalization), then multiply it by $g-1$ and then finally add it to the original audio signal Y. When $g \leq 1$, the encoder will multiply the estimated dialogue component D (without processing) by a factor of $g-1$ and add it to the original audio signal Y. It is noted that this latter case corresponds to attenuating the dialogue, as the factor g−1 will be less than zero. The summation in point 16 will thus in this case be a subtraction.

Figure 2:
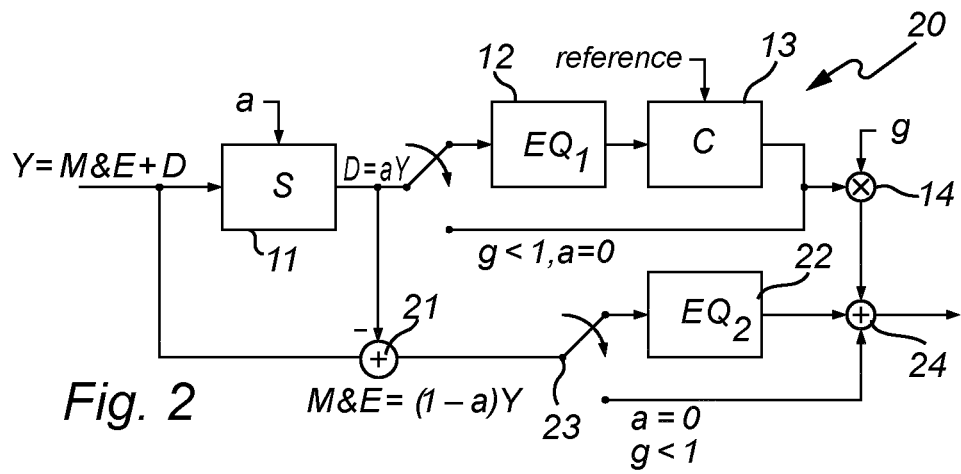
FIG. 2 is a block diagram of a decoder according to a second embodiment of the present invention.

A more elaborate embodiment is shown in FIG. 2. Here, the decoder 20 additionally includes a subtraction point 21 configured to subtract the estimated dialogue D from the input audio signal Y, thereby forming an estimated "non-dialogue" component, often referred to as M&E (music and effects). The decoder in FIG. 2 further includes a processing path with a second equalizer 22, the output of which is connected to a summation point 24. The second equalizer 22 is preceded by a second switch 23, in this embodiment again configured to supply the M&E signal to the second equalizer 22 only when two conditions are fulfilled:

1) the user selected gain factor g is greater than 1, and
2) the dialogue enhancement parameter a(m, k) is non-zero for the time-frequency tile, i.e. there is dialogue present.

In FIG. 2, the summation point 24 is connected to add either the processed M&E from the equalizer 22, or the non-processed M&E directly from switch 23. The result of the summation is the dialogue enhanced audio signal.

Figure 9A:
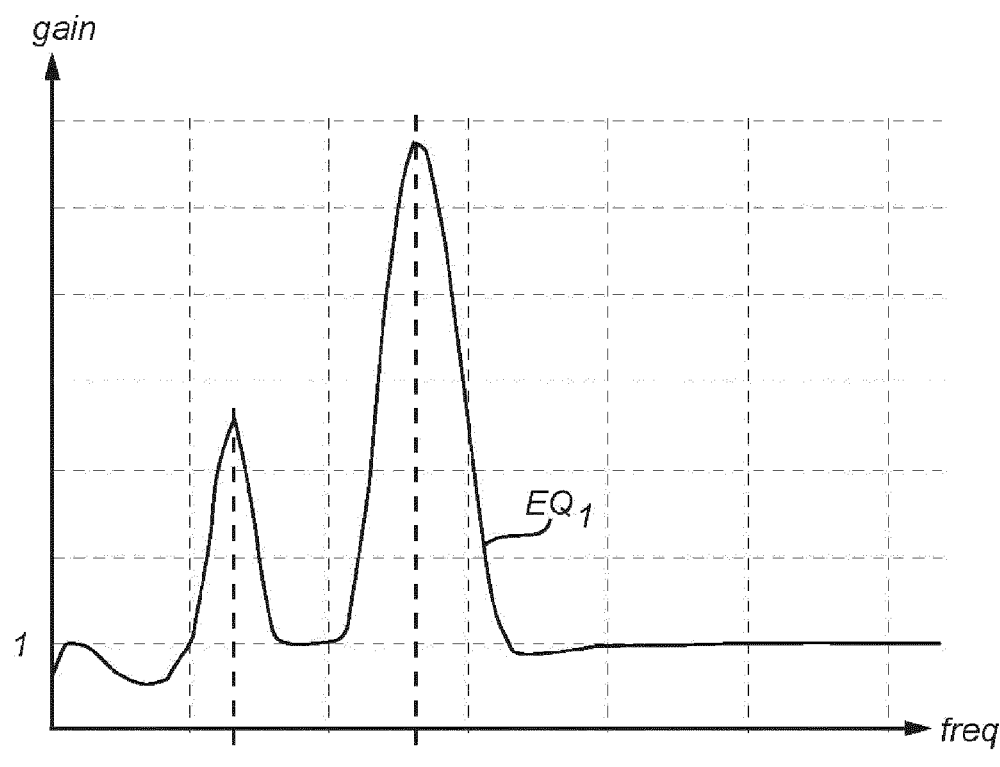
FIGS. 9a and 9b are two examples of equalization functions for the equalizers in FIG. 2.
Figure 9B:
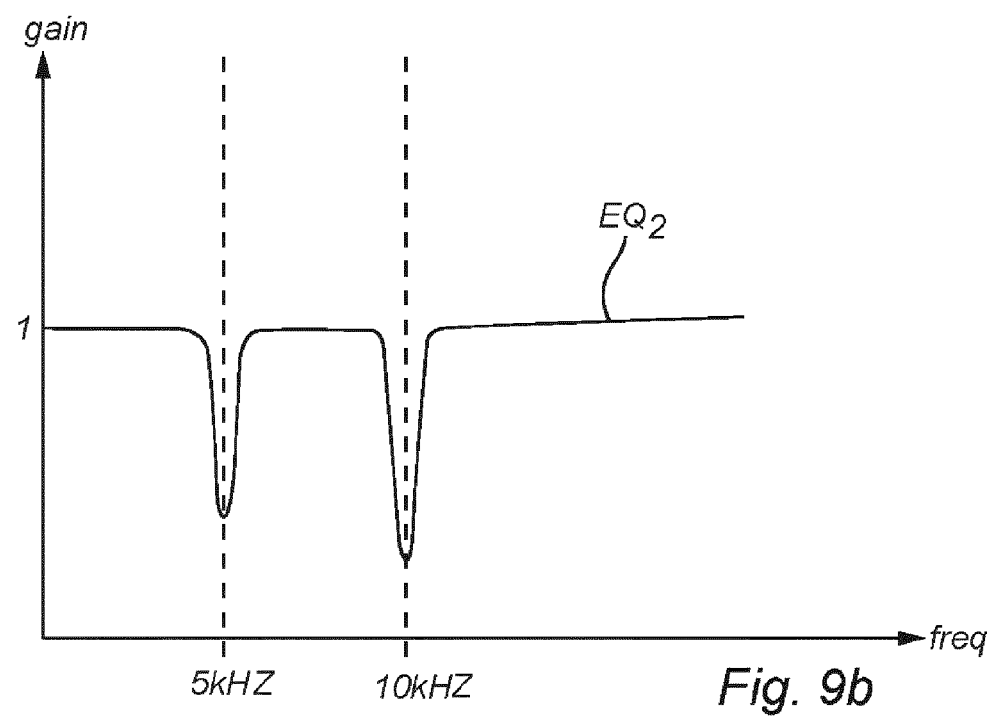

The equalizers 12, 22 in FIGS. 1 and 2 are typically configured to apply a frequency dependent, (complex) gain to the input signal (i.e. the estimated dialogue signal or the M&E signal). The first and the second equalizer 12, 22 can be functionally inter-related, e.g. in the sense that when the gain function of the first equalizer has boost the gain function of the second equalizer has a corresponding (but typically more narrow-band) cut. This is illustrated in FIGS. 9a, 9b, for exemplary equalizer gain functions $EQ_1$ and $EQ_2$. The first gain function $EQ_1$ here has a roll off below around 400 Hz, a slight valley (i.e. attenuation) around 3 kHz, and peaks around 5 kHz and 10 kHz. The second gain function $EQ_2$ has corresponding cuts around 5 kHz and 10 kHz. It is noted that these gain functions are only examples, and that the details of the gain functions will depend on the actual application and the desired effect.

The compressor 13 in FIGS. 1 and 2 may be a single-band compressor with parameters such as threshold, compression ratio, attack time, release time and makeup gain. The compression parameters can be decoded from the bit stream and may be different for every frame. For example, the compression ratio may be 5:1, 10:1 or 20:1. The attack may be 10 ms, the release may be 250 ms, the relative threshold may be −6 dB, and the makeup gain may be 10 dB. The threshold (i.e. the lower limit for compression to set in) may be set relative to a long- or short-term loudness level of reference. For example, it may be set relative to a dialogue normalization value, which may be an indication of the average dialogue loudness in the audio signal. The dialogue normalization value may possibly be adjusted for local deviations based on additional information, which may also be provided in the bit stream.

Implementation as a Matrix Multiplication

It is noted that the block diagrams in FIGS. 1 and 2 are schematic representations of the functionality of the decoders. A more practical implementation will typically be realized as a matrix multiplication Z=H·Y, where Y is the input audio signal, H is a transfer function in the form of an input-output matrix, and Z is the dialogue enhanced output signal.

Consider dialogue enhancement in the quadrature mirror filter (QMF) domain, with an input audio signal Y≡Y(m,k), where m is the time slot index and k is the frequency band index, and the estimated dialogue component (for the specific time-frequency tile) is D=aY, where a(m, k) may be interpolated between bit stream updates. Further, let $\tilde{V} \equiv \tilde{V}(m) = \sqrt{\Sigma_k |D(m,k)|^2}$ represent the instantaneous envelope value of D for all k. Then, if a>0 and g>1, the dialogue enhanced output Z is given by:

$$Z = g \cdot C[EQ_1(D)] + EQ_2(M\&E)$$

$$Z = g \cdot C[q_1 \cdot D] + q_2 \cdot M\&E$$

$$Z = g \cdot f \cdot q_1 \cdot D + q_2 \cdot M\&E,$$

where $q_1$ and $q_2$ are the EQ coefficients, and f is the compression gain which is a function of the envelope value $\tilde{V}$ of $\tilde{D} = EQ_1(D)$.

Given that $$D = a \cdot Y,$$

$$M\&E = (1-a) \cdot Y,$$

the output Z can be written as $$Z = g \cdot f \cdot q_1 \cdot a \cdot Y + q_2 \cdot (1-a) \cdot Y$$

$$Z = [g \cdot f \cdot q_1 \cdot a + q_2 \cdot (1-a)] \cdot Y$$

$$Z = [(g \cdot f \cdot q_1 - q_2) \cdot a + q_2] \cdot Y,$$

or simply as $$Z = H_{DE\_on} \cdot Y$$

where $H_{DE\_on} = (g \cdot f \cdot q_1 - q_2) \cdot a + q_2$ is the complete transfer function of dialogue enhancement according to an embodiment of the invention. Thus, in a practical implementation, the coefficients of a static EQ curve can be stored in a lookup table and only the compression gain f needs to be computed from $\tilde{V}$ before H can be applied to Y.

In a multi-channel setup, the compression gain f is obtained in a similar manner by computing the gain for each channel separately and taking the smallest gain as the common gain for all channels. This is equivalent to computing the instantaneous envelope value for each channel separately and deriving the gain from the largest envelope value.

In the case where the additional processing of the estimated dialogue D is turned off (g<1), then $f = q_1 = q_2 = 1$ and the output Z becomes $$Z = [(g-1) \cdot a + 1] \cdot Y,$$

or equivalently $$Z = H_{DE\_off} \cdot Y$$

with $$H_{DE\_off} = (g-1) \cdot a + 1.$$

The need to have an extra buffer for D and/or $\tilde{D}$ can be eliminated by computing the envelope $\tilde{V}$ as $$\tilde{V} \equiv \tilde{V}(m) = \sqrt{\Sigma_k |q_1(k) \cdot a(m,k) \cdot Y(m,k)|^2},$$

where a(m, k) again may be interpolated between bit stream updates.

Encoder-Side Implementation

Figure 3:
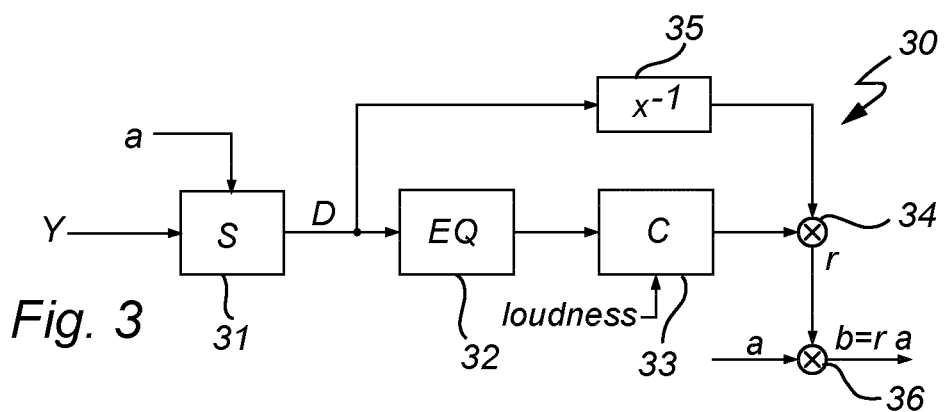
FIG. 3 is a block diagram of part of an encoder according to an embodiment of the present invention.

The approach described with reference to FIG. 2 can also be applied on the encoder side, as illustrated in FIG. 3.

An encoder of a dual-ended system includes digital processing circuitry (not shown) for calculating a set of time varying dialogue enhancement parameters a, which are to be included in the bit stream, so that the decoder is able to estimate a dialogue component from an audio signal.

FIG. 3 illustrates a section of the encoder, including a dialogue estimation block 31 (similar to the dialogue estimation block 11 above) for estimating the dialogue component D present in the audio signal Y using the parameters a which have previously been calculated in the encoder. The encoder further includes a processing path with an equalizer 32 and a compressor 33, which receives the estimated dialogue component D and provides the processed result to a multiplier 34. The encoder also includes an $x^{-1}$ inverter 35, which receives the estimated dialogue component D and outputs an inverted dialogue component $D^{-1}$ which is provided to the multiplier 34. The output of the multiplier is connected to a second multiplier 36, which also receives the dialogue enhancement parameters a.

In use, the multiplier 34 will receive the processed dialogue component and multiply it with 1/D, i.e. it will provide a ratio r between the processed dialogue component and the estimated dialogue component. The ratio r is typically specific for one time-frequency tile. The ratio r thus represents the contribution of the processing path 32, 33 with reference to the estimated dialogue component for a specific time-frequency tile. For each tile, the multiplier 36 will multiply the DE parameter a with the ratio r and output a modified DE parameter b. The complete set of modified DE parameters b is then encoded in the bit stream together with the audio signal.

Figure 4:
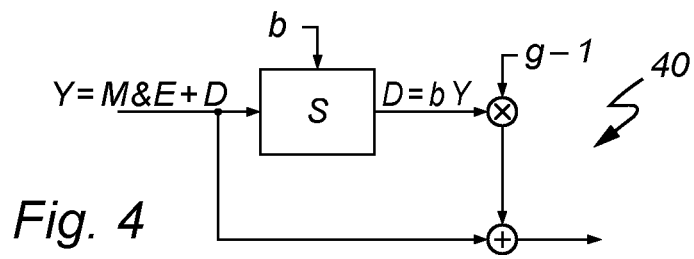
FIG. 4 is a decoder suitable for use with the encoder solution in FIG. 3.

When an embodiment of the present invention is implemented on the encoder side (as illustrated in FIG. 3), it is backward compatible with existing decoders, such as the one illustrated in FIG. 4. By multiplying the received signal Y by the set of modified DE parameters b, the decoder is able to reproduce the processed dialogue signal output from compressor 33 of the encoder in FIG. 3. When such processed dialogue signal is scaled by g−1 and then added back into Y, as shown in the decoder of FIG. 4, it is possible to produce an improved dialogue enhancement signal even in an existing decoder.

Practical Implementation

Figure 5:
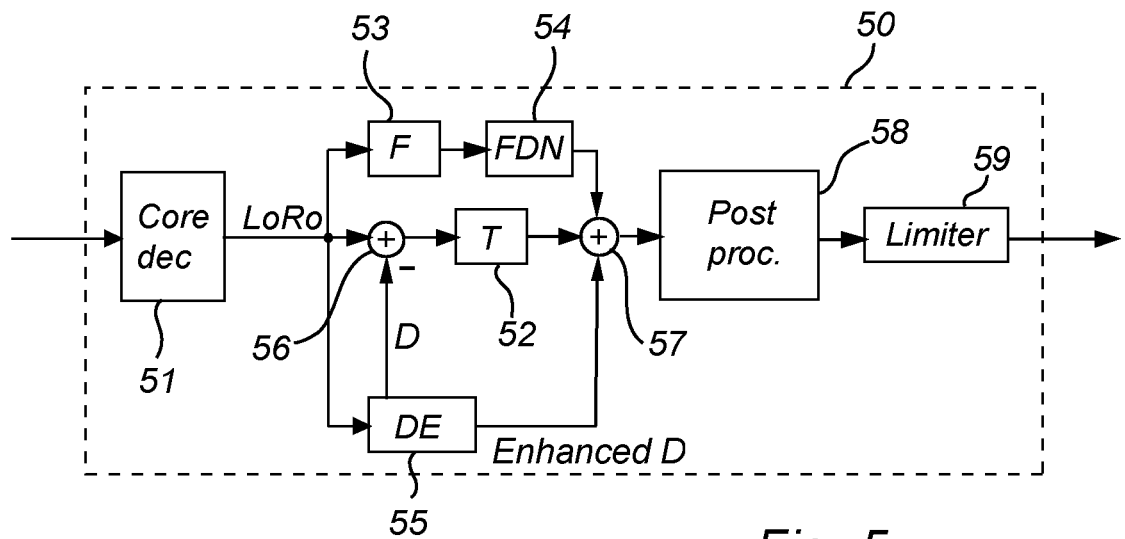
FIG. 5 is a block diagram of a more detailed implementation of the decoder in FIG. 2.

FIG. 5 schematically illustrates how dialogue enhancement according to a practical embodiment of the invention may be implemented in an existing decoder topology. As illustrated in FIG. 5, the decoder 50 generally comprises a core decoder 51, for decoding the received bit stream, an optional transform 52 e.g. a binaural transform T, an optional late reverberation processing path including a matrix transform 53 and a feedback delay network (FDN) block 54. The encoder further includes a dialogue enhancement (DE) block 55, providing outputs to two summation points 56, 57 (corresponding to the two summation points 21, 24 in FIG. 2). Finally, the decoder 50 comprises a post processing block 58 providing e.g. volume control, and a limiter 59.

Figure 6:
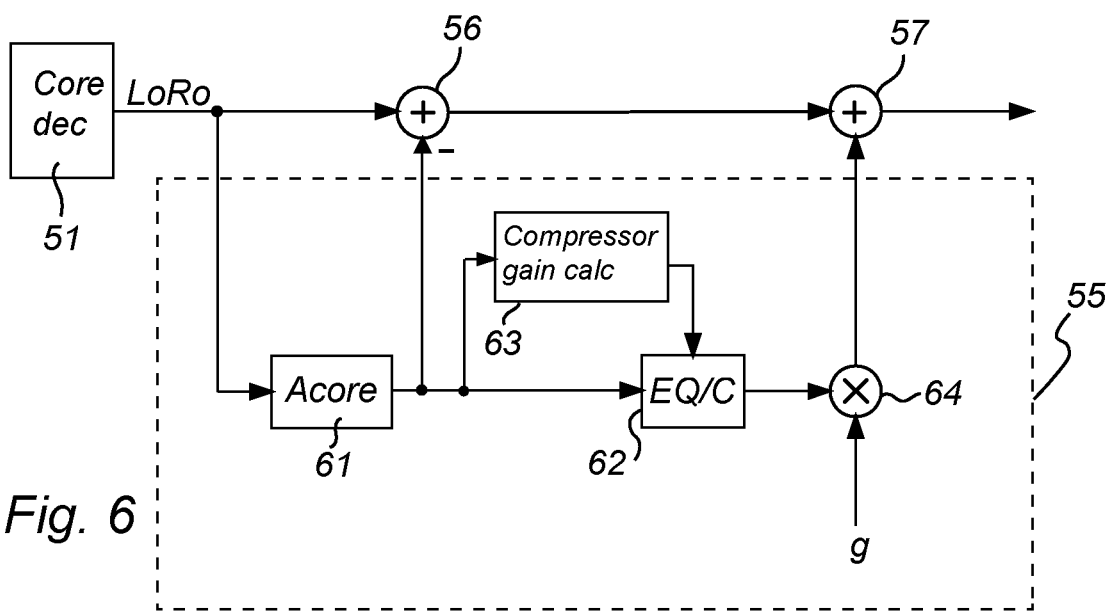
FIG. 6 is a block diagram showing the dialogue enhancement component in FIG. 5 according to one embodiment of the invention.

FIG. 6 shows an example of the dialogue enhancement block 55 in FIG. 5 for the specific case of stereo audio. The block 55 comprises a dialogue estimation block 61 (corresponding to the block 11 in FIGS. 1 and 2), using a transform $A_{core}$ to estimate the dialogue component, and further a processing block 62 for providing equalization and compression of the estimated dialogue. In the case where no equalization is applied to the M&E signal, the transform in block 62 is equivalent to $f(m) \cdot q_1(k)$, and $q_2(k)=1$. A multiplication point 64 (corresponding to multiplier 14 in FIGS. 1 and 2) multiplies the processed dialogue with a user determined gain g.

In the illustrated embodiment, the compression in block 62 is provided with a sidechain 63 which calculates an appropriate compressor gain based on the estimated dialogue signal. It is noted that the equalization in block 62 may also be provided upstream to the sidechain branch, such that the input to the sidechain 63 is also subject to the equalizer. Another option is to apply a separate equalizer in the sidechain 63. This equalizer may then be different than the equalizer in block 62.

For the case of stereo audio, and using the QMF bank notation, the mapping from LoRo $y(m,k)=[Y_1(m, k) \ Y_2(m, k)]^T$ (with index "1" representing the left channel and index "2" respectively representing the right channel of a stereo channel pair) to dialogue enhanced LoRo $z(m, k)=[Z_1(m, k) \ Z_2(m, k)]^T$ can be expressed as $$z(m,k)=H_{DE\_on}(m,k) \cdot y(m,k)$$

where again m is the time slot index and k is the frequency band index and with $$H_{DE\_on}=[g \cdot f(m) \cdot q_1(k) \cdot I_2 - q_2(k) \cdot I_2] \cdot A_{core}(m,k) + (q_2(k) \cdot I_2$$

Here, $A_{core}$ is a 2-by-2 matrix that estimates LoRo dialogue from LoRo complete main. Typically, $A_{core}$ is divided in eight frequency bands and interpolated between bit stream updates that happen every 2048 samples at the nominal frame rate.

g is the user gain that determines the amount of dialogue boost. It can vary from frame to frame and may require interpolation between frames.

f(m) is the compressor gain that is computed for every time slot m. The gain is broadband. Thus, there is no dependency on k. In addition, the same compressor gain is typically used for each channel. Therefore, f (m) is a scalar.

$q_1(k)$ is a time-invariant EQ curve applied to the dialogue signal.

$q_2(k)$ is a time-invariant EQ curve applied to the music-and-effects signal.

$I_2$ is a 2-by-2 identity matrix.

The 5.1 surround case is easily derived from the stereo case. The only difference is that only the three front channels L/R/C (left/right/center) are processed by the dialogue enhancement according to an embodiment of the invention. Similar to the two-channel example described previously, the same compressor gain is typically used for each of the three front channels. In FIG. 6, the transform "Acore" in block 61 is now a 3-by-3 (diagonal) matrix with the corresponding DE parameters as its elements, and which is applied to only the front three channels of the 5.1 surround signal to estimate the dialogue signal.

Figure 7A:
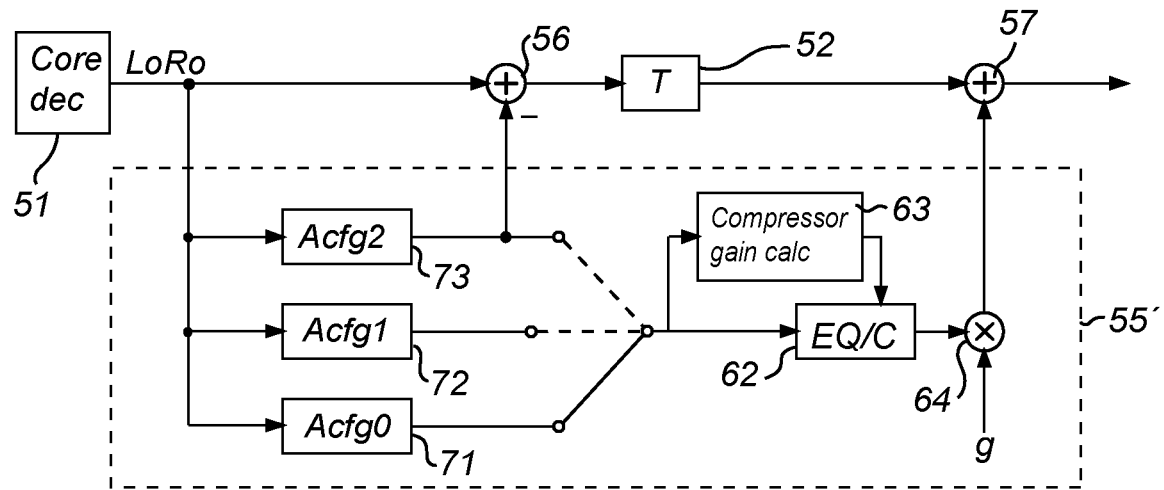
FIGS. 7a and 7b are block diagrams showing two examples of the dialogue enhancement component in FIG. 5 according to another embodiment of the invention.

FIG. 7a shows another example of a dialogue enhancement block 55' for an alternative stereo implementation, here including a binaural transform 52. See WO2017/035281 and WO2017/035163 for details of binaural transformation, both herewith incorporated by reference.

In the figure, there are three different dialogue estimation blocks 71, 72 and 73 representing different modes (also called "configurations") of the transform A, labelled as $A_{cfg0}$, $A_{cfg1}$, and $A_{cfg2}$ (for details see WO2017/132396, herewith incorporated by reference). It is noted that $A_{cfg2}$ is equivalent to $A_{core}$ in FIG. 6. Blocks 62 and 63 are similar to those in FIG. 6.

In this alternative stereo implementation, and again using the QMF bank notation, the mapping from LoRo $y(m, k)=[Y_1(m, k) \ Y_2(m, k)]^T$ to dialogue enhanced LaRa (binaural) $z(m, k)=[Z_1(m, k) \ Z_2(m, k)]^T$ can be expressed as $$z(m,k)=H_{DE\_on}(m,k) \cdot y(m,k)$$

with $$H_{DE\_on} = g \cdot f(m) \cdot q_1(k) \cdot A_{cfgX}(m,k) + q_2(k) \cdot T(m,k) \cdot [I_2 - A_{cfg2}(m,k)].$$

Here,

T is a 2-by-2 matrix that converts the stereo signal into a binaural signal. T is interpolated between bit stream updates, which occur e.g. every 4096 samples at the nominal frame rate.

$A_{cfgX}$ is a 2-by-2 matrix that estimates dialogue from LoRo complete main, where X indicates the mode (configuration). Some modes include a binaural transformation. Note that in FIG. 7a $A_{cfg2} = A_{core}$ is used to generate the M&E signal.

Figure 7B:
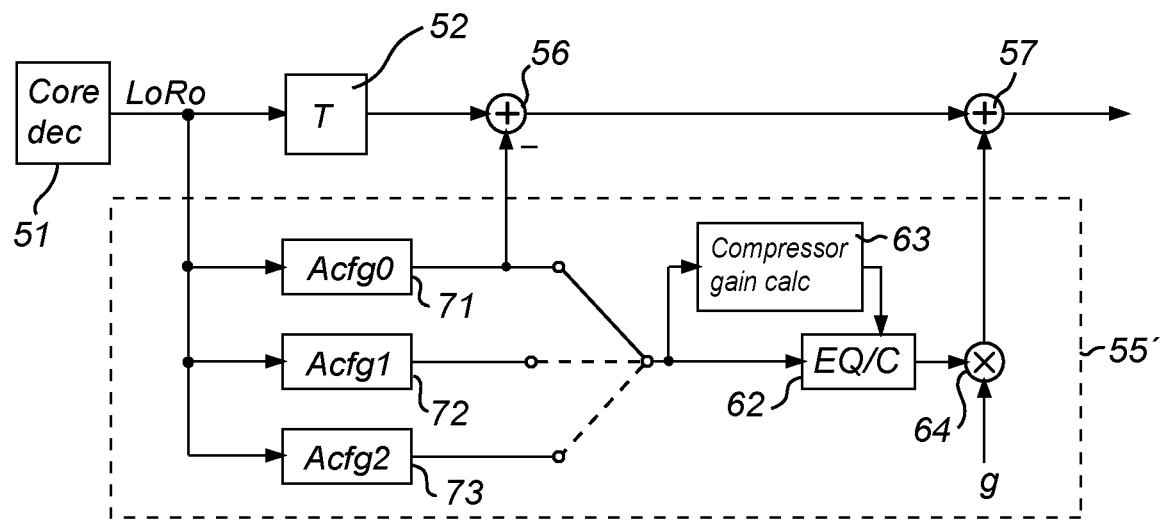

As an alternative, the dialogue enhancement 55' in FIG. 7a can be applied after the stereo signal is converted to a binaural signal (i.e. after block 52). This is disclosed in FIG. 7b, where similar elements have been given the same reference numerals as in FIG. 7a. Note that in the illustrated case, $A_{cfg0}$ is used to generate the (binaural) M&E signal.

The subtraction of estimated dialogue from the stereo signal is only relevant if a binaural version of dialogue is present in the bit stream. The subtraction process can be omitted at the cost of a reduced performance. The interpretation of the user gain g changes if subtraction is omitted. In that case, a user gain equal to 0 means no dialogue enhancement and a user gain equal to 1 yields a 6-dB boost. Negative values of g would result in attenuation, but since the dialogue after dialogue enhancement is different from the dialogue in stereo signal, poor attenuation is to be expected, and so the dialogue enhanced signal at the output would suffer from distortion.

Figure 8:
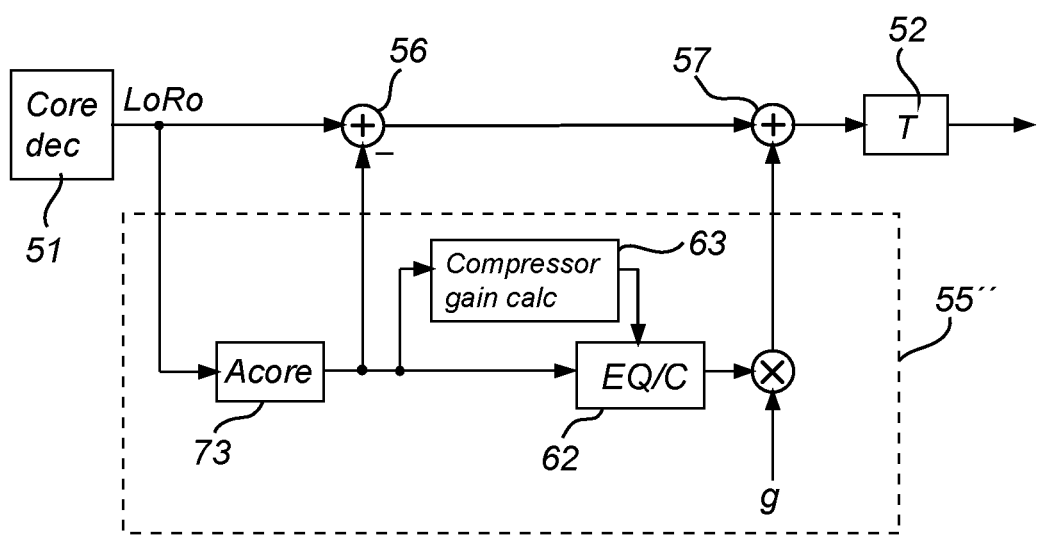
FIG. 8 is a block diagram showing the dialogue enhancement component in FIG. 5 according to yet another embodiment of the invention.

In yet another embodiment, dialogue enhancement 55" can be applied before the conversion of dialogue enhanced stereo signal to a binaural signal, as shown in FIG. 8, where again similar elements have been given the same reference numerals as in FIG. 7a. In this case the above configurations (cfg1, cfg2, cfg3) are superfluous, and only the core configuration ($A_{core}$) is required (block 73). In fact, this variant corresponds to a cascade of 1) a stereo decoder with dialogue enhancement 55", 56, 57, and 2) a binaural transform 52.

Cross-Fade

In some embodiments the decoder may be configured to switch between conventional dialogue enhancement (i.e. without compression and equalizing of the dialogue) and dialogue enhancement according to the present invention. Such switching may be based e.g. on steering data in the bitstream. For simplicity, conventional dialogue enhancement is here abbreviated DE, while dialogue enhancement according to the present invention is referred to as ADE ("advanced" dialogue enhancement). Switching between DE and ADE may lead to audible jumps in loudness potentially degrading the user experience.

In order to mitigate the audible effect of such discontinuities in the applied dialogue enhancement the decoder may include a transition mechanism. The transition mechanism can be a cross-fade, which is popularly used for seamless switching. Generally speaking, cross-fade means that an output is gradually switched from a first signal A to a second signal B over a given time period. It can be expressed as:

$$\text{cross\_fade\_output} = f\_\text{smooth} \times A + (1 - f\_\text{smooth}) \times B,$$

where f_smooth is a weighting factor which is ramped down from 1 to 0 in the case output is switched from A to B and ramped up from 0 to 1 when output is switched from B to A.

In the present case, the weighting factor can be defined by the following function, which generates a ramp from 0 to 1 when ADE is switched ON ($ADE_{switch} = 1$) and an inverse ramp from 1 to 0 when such dialogue enhancement is switched OFF ($ADE_{switch} = 0$).

$$f_{smooth}(t, ADE_{switch}) = \begin{cases} f_{ramp}(t), & ADE_{switch} = 1(\text{``on''}); \\ 1 - f_{ramp}(t), & ADE_{switch} = 0(\text{``off''}) \end{cases}$$

$$f_{ramp}(t) = \begin{cases} 0, & t \leq 0; \\ \frac{t}{\tau}, & 0 < t \leq \tau; \\ 1, & \tau < t \end{cases}$$

The duration of the ramp is determined by a time constant $\tau$. The time constant may be one or several decoder processing frames. In the given example, the ramp is linear, but it may be any function that smoothly transitions between 0 and 1 within the time $\tau$. For example it could be a logarithmic, quadratic, or cosine function.

Figure 10A:
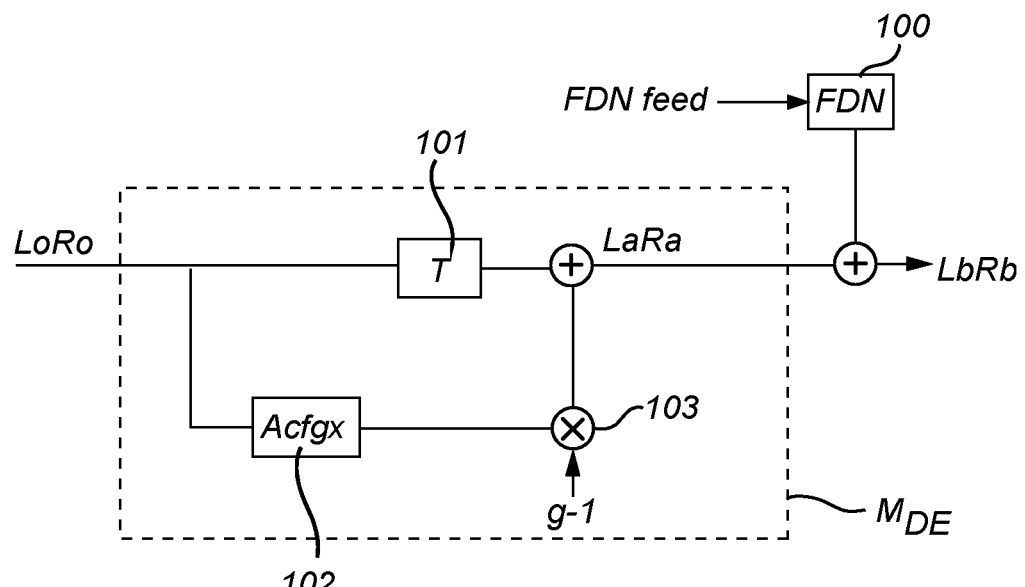
FIG. 10a schematically illustrates an example of dialogue enhancement according to a conventional approach.
Figure 10B:
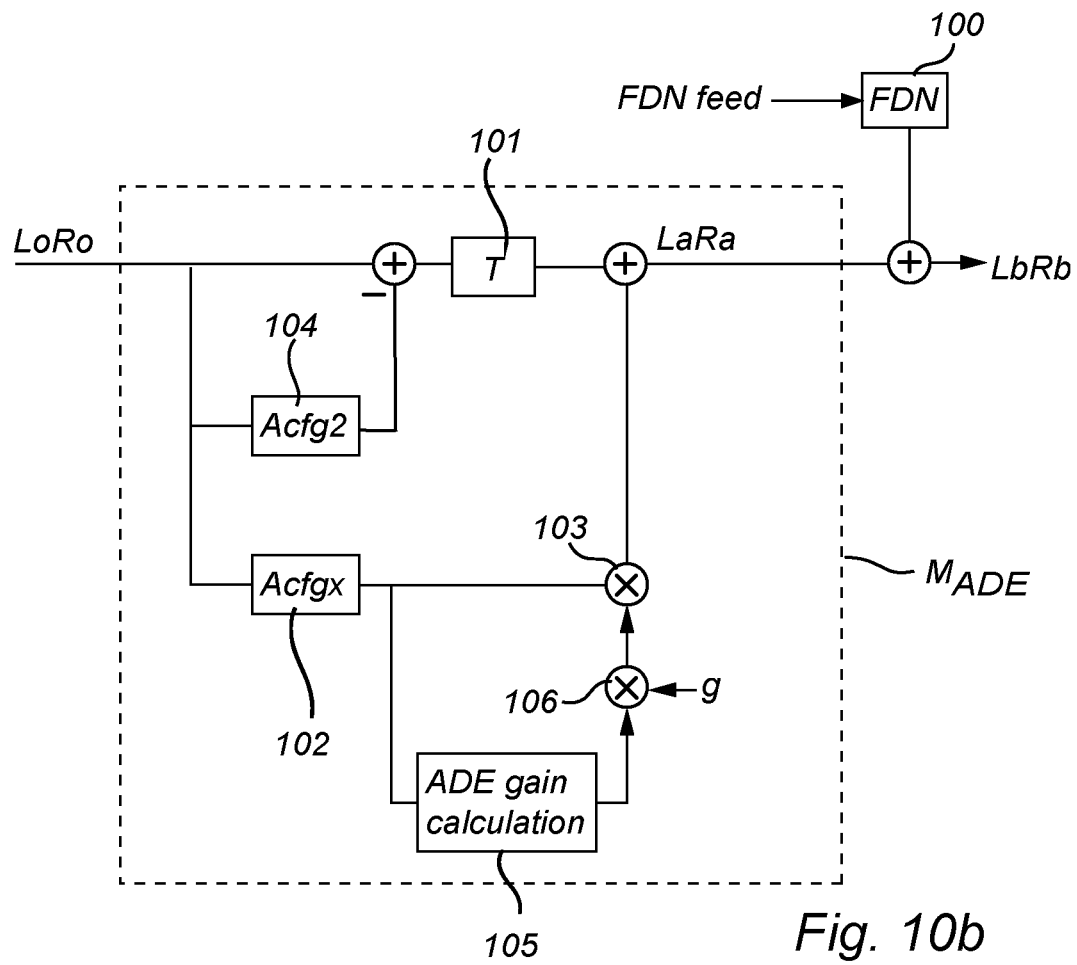
FIG. 10b schematically illustrates an example of dialogue enhancement according to an embodiment of the invention.

FIGS. 10a and 10b schematically illustrate dialogue enhancement in an immersive stereo system according to the conventional approach (FIG. 10a) and according to an embodiment of the present invention (FIG. 10b). It is noted that FIG. 10b essentially corresponds to FIG. 7a discussed above. However, the equalizer and compressor stages have here been illustrated as an application of gains, calculated in ADE gain calculation block 105.

It is noted that an immersive stereo system is used as an example, and that the principles of cross-fade may be implemented also in other applications which switch between DE and ADE.

In both cases, an input LoRo stereo signal is processed to provide a dialogue enhanced immersive LaRa signal. In FIG. 10a, a matrix $M_{DE}$ is applied to the LoRo signal, while in FIG. 10b, a matrix $M_{ADE}$ is applied to the LoRo signal. At the end, an FDN (Feedback Delay Network) 100 receives an FDN feed signal and generates an FDN signal which is mixed in to get final headphone output LbRb with enhanced dialog.

From FIG. 10a, and using the notations used earlier in the text, it follows that:

$$M_{DE} = T + (g-1) \times A_{cfgX},$$

where T is applied in block 101, $A_{cfgX}$ is applied in block 102, and the appropriate gain (g−1) is applied in multiplication point 103.

From FIG. 10b, and again using notations used earlier in the text, it follows that:

$$M_{ADE} = T \times (I_2 - A_{cfg2}) + g \times A_{cfgX} \times \text{ADE\_gain},$$

where T and $A_{cfgX}$ are again applied in blocks 101 and 102, respectively, $A_{cfg2}$ is applied in block 104, ADE_gain is calculated in block 105, subject to gain g in multiplication point 106, and finally applied in multiplication point 103.

It is noted that when dialogue enhancement is realized in the CQMF domain, $M_{ADE}$ and $M_{DE}$ are both time-slot and CQMF-band varying 2×2 matrices, and LoRo and LaRa are both timeslot and CQMF-band varying 2×1 matrix (column vectors). As above, $I_2$ is a 2-by-2 identity matrix.

A cross faded LaRa signal, i.e. a cross-fade of the LaRa signal in FIG. 10a and the Lara signal in FIG. 10b can be implemented by applying the weighting function f_smooth defined above directly on the matrices $M_{ADE}$ and $M_{DE}$, according to:

$$LaRa_{cross\text{-}fade} = (M_{ADE} \times f\_smooth + M_{DE} \times (1-f\_smooth)) \times LoRo$$

Figure 10C:
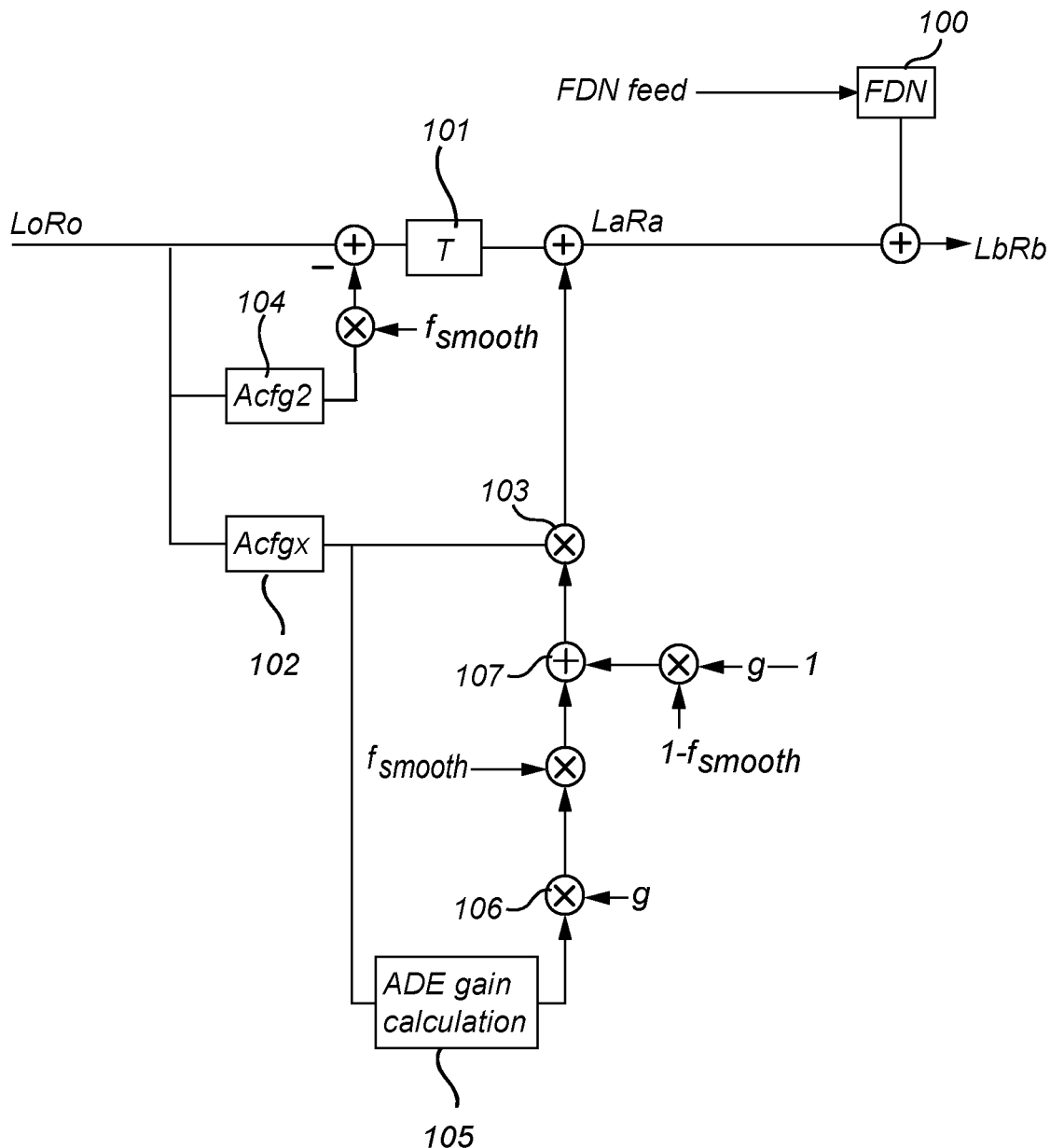
FIG. 10c schematically illustrates an example of dialogue enhancement according to another embodiment of the invention.

FIG. 10c is an schematic illustration of this as a block diagram based on the diagrams in FIGS. 10a and 10b.

In FIG. 10c, the weight f_smooth is applied to the output from block 104, such that the subtraction of dialogue in FIG. 10b is faded in as f_smooth approaches 1. Further, the weight f_smooth is applied to the multiplication point 106 and the weight (1−f_smooth) is applied to the gain (g−1). These two weighted gains are then summed in a summation point 107, before being connected to the multiplication point 103. This means that, for f_smooth=0, the multiplication point 103 will receive the same input as in FIG. 10a, while for f_smooth=1, the multiplication point 103 will receive the same input as in FIG. 1b.

Generalizations

Reference throughout this specification to "one embodiment", "some embodiments" or "an embodiment" means that a particular feature, structure or characteristic described in connection with the embodiment is included in at least one embodiment of the present invention. Thus, appearances of the phrases "in one embodiment", "in some embodiments" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

As used herein, the term "exemplary" is used in the sense of providing examples, as opposed to indicating quality. That is, an "exemplary embodiment" is an embodiment provided as an example, as opposed to necessarily being an embodiment of exemplary quality.

It should be appreciated that in the above description of exemplary embodiments of the invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claims require more features than are expressly recited therein. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described specific embodiments of the invention, those skilled in the art will recognize that other and further modifications may be made thereto. For example, any formulas given above are merely representative of procedures that may be used. Functionality may be added or deleted from the block diagrams and operations may be interchanged among functional blocks. Steps may be added or deleted to methods described within the scope of the embodiments of the present invention.

For example, a decoder implementing the invention may include different processing blocks than those shown in FIG. 5.

The embodiments of the present invention relate to the following enumerated exemplary embodiments (EEEs).

EEE1. A method for dialogue enhancement of an audio signal, comprising:
receiving an encoded bit stream including the audio signal,
obtaining a set of time-varying parameters configured to estimate a dialogue component present in said audio signal, estimating said dialogue component from said audio signal, applying a compressor to said estimated dialogue component, to generate a processed dialogue component, applying a user-determined gain to the processed dialogue component, to provide an enhanced dialogue component, and combining said enhanced dialogue component with said audio signal to form a dialogue-enhanced audio signal.

EEE2. The method in EEE1, further comprising applying a first equalizer to the estimated dialogue component before applying the compressor.

EEE3. The method in EEE1 or EEE2, wherein the step of combining the enhanced dialogue component with the audio signal includes forming a non-dialogue component by subtracting the dialogue component from the audio signal, and summing said non-dialogue component with said enhanced dialogue component.

EEE4. The method in EEE3, further comprising applying a second equalizer to the non-dialogue component before summing it with said enhanced dialogue component.

EEE5. The method in EEE4, wherein said second equalizer is functionally inter-related with the first equalizer.

EEE6. The method according to one of the preceding EEEs, wherein said set of time-varying parameters include one parameter for each of a set of frequency bands.

EEE7. The method according to one of the preceding EEEs, wherein the encoded bit stream includes the time-varying parameters.

EEE8. The method according to EEE7, wherein the encoded bit stream also includes compression parameters for configuring the compressor.

EEE9. The method according to EEE7 or 8, wherein the encoded bit stream also includes steering data for configuring said first equalizer and, if present, said second equalizer.

EEE10. The method according to one of the preceding EEEs, further comprising applying a cross-fade to activate the step of combining the enhanced dialogue component with the audio signal and, when applicable, to activate the step of subtracting the estimated dialogue from the audio signal.

EEE11. A method for encoding an audio signal to enable dialogue enhancement, comprising:

providing an audio signal, providing a set of time-varying dialogue-enhancement parameters configured to estimate a dialogue component present in said audio signal, estimating an estimated dialogue component by applying the dialogue-enhancement parameters to the audio signal, applying a compressor to said estimated dialogue component, to generate a processed dialogue component, dividing said processed dialogue component by said estimated dialogue component, to determine a set of time-varying adjustment gains, and combining said dialogue-enhancement parameters with said adjustment gains, to provide a set of modified dialogue-enhancement parameters, and encoding said audio signal and said modified dialogue-enhancement parameters in a bit stream.

EEE12. The method in EEE11, further comprising applying an equalizer to the estimated dialogue component before applying the compressor.

EEE13. The method according to one of EEE11 or EEE12, wherein said set of time-varying parameters include one parameter for each of a set of frequency bands.

EEE14. A decoder for dialogue enhancement of an audio signal, said decoder having obtained a set of time-varying parameters configured to estimate a dialogue component present in said audio signal, the decoder comprising:

a decoder element for decoding the audio signal received in an encoded bit stream, a dialogue estimator for estimating said dialogue component from said audio signal, a compressor for compressing the estimated dialogue component to generate a processed dialogue component, a gain element for applying a user determined gain to the processed dialogue component, to provide an enhanced dialogue component, and a combining path for combining said enhanced dialogue component with said audio signal to form a dialogue-enhanced audio signal.

EEE15. The decoder in EEE14, further comprising a first equalizer for equalizing the estimated dialogue component before applying the compressor.

EEE16. The decoder in EEE14 or EEE15, wherein the combining path comprises a subtractor for subtracting the dialogue component from the audio signal to form a non-dialogue component, and a summation point for summing said non-dialogue component with said enhanced dialogue component.

EEE17. The decoder in EEE16, further comprising a second equalizer for equalizing the non-dialogue component before summing it with said enhanced dialogue component.

EEE18. The decoder in EEE17, wherein said second equalizer is functionally inter-related with said first equalizer.

EEE19. The decoder according to one of EEE14-EEE18, wherein the encoded bit stream includes the time-varying parameters, and wherein the decoder element is configured to decode said time-varying parameters.

EEE20. The decoder according to EEE19, wherein the encoded bit stream includes compression parameters for configuring the compressor.

EEE21. The decoder according to EEE19 or EEE20, wherein the encoded bit stream includes steering data for configuring said first equalizer and, if present, said second equalizer.

EEE22. An encoder for encoding an audio signal to enable dialogue enhancement, comprising:

a dialogue estimator for estimating a dialogue component present in an audio signal by applying set of time varying dialogue enhancement parameters to the audio signal, a compressor for compressing said estimated dialogue component, to generate a processed dialogue component, a divider for dividing said processed dialogue component by said estimated dialogue component, to determine a set of time-varying adjustment gains, a combiner for combining said dialogue enhancement parameters with said adjustment gains, to provide a set of modified dialogue enhancement parameters, and an encoder element for encoding said audio signal and said modified dialogue enhancement parameter in a bit stream.

EEE23. The encoder in EEE22, further comprising an equalizer for equalizing the estimated dialogue component before applying the compressor.

EEE24. A computer program product, comprising computer code portions configured to, when executed on one or more processors, cause the processors to perform the method of one of EEE1-EEE10.

EEE25. A non-transitory storage medium, storing the computer program product of EEE24.

EEE26. A computer program product, comprising computer code portions configured to, when executed on one or more processors, cause the processors to perform the method of one of EEE11-EEE13.

EEE27. A non-transitory storage medium, storing the computer program product of EEE26.

The invention claimed is:

1. A method for dialogue enhancement of an audio signal, comprising:
    receiving an encoded bit stream including the audio signal,
    obtaining a set of time-varying parameters configured to estimate a dialogue component present in said audio signal,
    estimating said dialogue component from said audio signal,
    applying a compressor only to said estimated dialogue component, to generate a processed dialogue component,
    applying a user-determined gain to the processed dialogue component, to provide an enhanced dialogue component, and
    combining said enhanced dialogue component with said audio signal to form a dialogue-enhanced audio signal, wherein combining the enhanced dialogue component with the audio signal includes forming a non-dialogue component by subtracting the estimated dialogue component from the audio signal, and summing said non-dialogue component with said enhanced dialogue component.

2. A non-transitory computer-readable storage medium comprising a sequence of instructions, which, when executed on one or more processors, cause the one or more processors to perform the method of claim 1.

3. A method for encoding an audio signal to enable dialogue enhancement, comprising:
    providing an audio signal,
    providing a set of time-varying dialogue-enhancement parameters configured to estimate a dialogue component present in said audio signal,
    estimating an estimated dialogue component by applying the set of time-varying dialogue-enhancement parameters to the audio signal,
    applying a compressor only to said estimated dialogue component, to generate a processed dialogue component,
    dividing said processed dialogue component by said estimated dialogue component, to determine a set of time-varying adjustment gains, and
    combining said set of time-varying dialogue-enhancement parameters with said set of time-varying adjustment gains, to provide a set of modified dialogue-enhancement parameters, and
    encoding said audio signal and said set of modified dialogue-enhancement parameters in a bit stream.

4. The method of claim 3, wherein the compressor is configured for increasing an average power of only the estimated dialogue component while keeping a peak level of the audio signal unchanged.

5. The method of claim 3, wherein said set of time-varying dialogue-enhancement parameters include one parameter for each of a set of frequency bands.

6. A non-transitory computer-readable storage medium comprising a sequence of instructions, which, when executed on one or more processors, cause the one or more processors to perform the method of claim 3.

7. A decoder for dialogue enhancement of an audio signal, said decoder having obtained a set of time-varying parameters configured to estimate a dialogue component present in said audio signal, the decoder comprising:
    a decoder element for decoding the audio signal received in an encoded bit stream,
    a dialogue estimator for estimating said dialogue component from said audio signal,
    a compressor for compressing only the estimated dialogue component to generate a processed dialogue component,
    a gain element for applying a user determined gain to the processed dialogue component, to provide an enhanced dialogue component, and
    a combining path for combining said enhanced dialogue component with said audio signal to form a dialogue-enhanced audio signal, wherein the combining path comprises a subtractor for subtracting the estimated dialogue component from the audio signal to form a non-dialogue component, and a summation point for summing said non-dialogue component with said enhanced dialogue component.

8. The decoder of claim 7, wherein the compressor is configured for increasing an average power of only the estimated dialogue component while keeping a peak level of the audio signal unchanged.

9. The decoder of claim 7, further comprising a limiter at an output of the decoder.

10. The decoder of claim 7, further comprising a first equalizer for equalizing the estimated dialogue component before applying the compressor.

11. The decoder of claim 10, further comprising a second equalizer for equalizing the non-dialogue component before summing it with said enhanced dialogue component.

12. The decoder of claim 11, wherein said second equalizer is functionally inter-related with said first equalizer.

13. The decoder of claim 11, wherein the first equalizer is configured to boost one or more frequency ranges of the dialogue component and the second equalizer is configured to cut one or more frequency ranges of the non-dialogue component.

14. The decoder of claim 13, wherein, for a given frequency range, the dialogue component boost has a boost bandwidth and the corresponding non-dialogue component cut has a cut bandwidth narrower than the boost bandwidth.

15. The decoder of claim 7, configured to apply the compressor to the estimated dialogue component if the user-determined gain is greater than one and if the estimated dialogue component is non-zero.

16. The decoder of claim 7, wherein the compressor is further configured to apply a make-up gain to the processed dialogue component to increase a level of the processed dialogue component back to a level of the estimated dialogue component.

17. The decoder of claim 7, wherein the encoded bit stream includes the set of time-varying parameters, and wherein the decoder element is configured to decode said set of time-varying parameters.

18. The decoder of claim 17, wherein the encoded bit stream includes compression parameters for configuring the compressor, and/or wherein the encoded bit stream includes steering data for configuring at least one of a first equalizer for equalizing the estimated dialogue component before applying the compressor and, if present, a second equalizer for equalizing the non-dialogue component before summing it with said enhanced dialogue component.

19. An encoder for encoding an audio signal to enable dialogue enhancement, comprising:
- a dialogue estimator for estimating a dialogue component present in an audio signal by applying a set of time varying dialogue enhancement parameters to the audio signal,
- a compressor for compressing only said estimated dialogue component, to generate a processed dialogue component,
- a divider for dividing said processed dialogue component by said estimated dialogue component, to determine a set of time-varying adjustment gains,
- a combiner for combining said set of time varying dialogue enhancement parameters with said set of time varying adjustment gains, to provide a set of modified dialogue enhancement parameters, and
- an encoder element for encoding said audio signal and said set of modified dialogue enhancement parameters in a bit stream.

20. The encoder of claim 19, further comprising an equalizer for equalizing the estimated dialogue component before applying the compressor.

* * * * *

UNITED STATES PATENT AND TRADEMARK OFFICE
CERTIFICATE OF CORRECTION

PATENT NO. : 12,087,317 B2
APPLICATION NO. : 17/603149
DATED : September 10, 2024
INVENTOR(S) : Stanislaw Gorlow et al.

It is certified that error appears in the above-identified patent and that said Letters Patent is hereby corrected as shown below:

In the Claims

Column 19, Line 4, Claim 18, delete "and, if present," and insert --and--

Signed and Sealed this
Fifth Day of November, 2024

Katherine Kelly Vidal
*Director of the United States Patent and Trademark Office*